(12) United States Patent
Kim (10) Patent No.: US 11,871,519 B2
(45) Date of Patent: Jan. 9, 2024

(54) DISPLAY DEVICE

(71) Applicant: Samsung Display Co., Ltd., Yongin-Si (KR)

(72) Inventor: Taejin Kim, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 692 days.

(21) Appl. No.: 17/081,467

(22) Filed: Oct. 27, 2020

(65) Prior Publication Data

US 2021/0219432 A1   Jul. 15, 2021

(30) Foreign Application Priority Data

Jan. 13, 2020  (KR) .......................... 10-2020-0004071

(51) Int. Cl.
| | | |
|---|---|---|
| *H05K 1/18* | (2006.01) | |
| *H05K 1/11* | (2006.01) | |
| *G09G 3/20* | (2006.01) | |

(52) U.S. Cl.
CPC .............. *H05K 1/189* (2013.01); *G09G 3/20* (2013.01); *H05K 1/111* (2013.01); *H05K 1/118* (2013.01); *H05K 2201/10022* (2013.01); *H05K 2201/10128* (2013.01); *H05K 2201/10189* (2013.01)

(58) Field of Classification Search
CPC ........ H05K 1/189; H05K 1/147; H05K 1/111; H05K 1/118; H05K 1/0262; H05K 2201/10022; H05K 2201/10128; H05K 2201/10189; H05K 2201/05; G09G 3/20; G09G 3/2003; G09G 3/2092; G09G 3/2096; G09G 3/3208; G09G 3/344; G09G 3/36; H10K 59/131; H10K 50/80; G02F 1/13458
See application file for complete search history.

(56) References Cited

U.S. PATENT DOCUMENTS

| | | | |
|---|---|---|---|
| 8,098,007 B2 | 1/2012 | Kim et al. | |
| 10,504,446 B2 | 12/2019 | Kim et al. | |
| 2011/0164005 A1* | 7/2011 | Miyata | ................. H05K 1/0215 345/204 |
| 2017/0322608 A1 | 11/2017 | Lee | |
| 2021/0202660 A1* | 7/2021 | Hong | .................... H05K 1/141 |

FOREIGN PATENT DOCUMENTS

| | | |
|---|---|---|
| JP | 5353969 B2 | 11/2013 |
| KR | 10-0475639 B2 | 3/2005 |
| KR | 10-2017-0126566 A | 11/2017 |
| KR | 10-2018-0003656 A | 1/2018 |
| KR | 10-2018-0003747 A | 1/2018 |

* cited by examiner

*Primary Examiner* — Roshn K Varghese
(74) *Attorney, Agent, or Firm* — Innovation Counsel LLP (57) ABSTRACT

A display device includes a driver including flexible circuit boards connected to a display panel. The driver includes a first source circuit board, a second source circuit board, a main circuit board including a controller that generates a power source voltage and applying the power source voltage to each of the first source circuit board and the second source circuit board, and a connector connecting the first source circuit board and the second source circuit board. The connector is electrically connected to a first voltage line that is the most adjacent to the second source circuit board among the voltage lines of the first source circuit board and a second voltage line that is the most adjacent to the first source circuit board among the voltage lines of the second source circuit board.

20 Claims, 10 Drawing Sheets

DISPLAY DEVICE

CROSS-REFERENCE TO RELATED APPLICATION

This U.S. non-provisional patent application claims priority under 35 U.S.C. § 119 to Korean Patent Application No. 10-2020-0004071, filed on Jan. 13, 2020, the contents of which are hereby incorporated by reference in its entirety.

BACKGROUND

Field of Disclosure

The present disclosure relates to a display device. More particularly, the present disclosure relates to a display device having an improved reliability.

Description of the Related Art

In a display device, a display panel is connected to a circuit board after the display panel is manufactured. For instance, the circuit board is bonded to the display panel by a tape automated bonding (TAB) using an anisotropic conductive film (ACF).

SUMMARY

The present disclosure provides a display device that is capable of preventing defects in a display panel due to an over-current (current deflection) generated when power source voltages supplied to circuit boards spaced apart from each other have different voltages due to a difference in length between lines and capable of minimizing a difference between power source voltages applied to the circuit boards spaced apart from each other by including a connector that connects the circuit boards spaced apart from each other.

Embodiments of the inventive concept provide a display device including a display panel comprising a plurality of pixels and a plurality of display pads connected to the plurality of pixels and arranged in a first direction to be spaced apart from each other and a driver applying a power source voltage to the plurality of pixels. The driver includes a plurality of flexible circuit boards connected to the plurality of display pads, a first source circuit board comprising a plurality of voltage lines connected to a first flexible circuit boards among the plurality of flexible circuit boards, a second source circuit board arranged in the first direction with the first source circuit board, spaced apart from the first source circuit board in the first direction, and comprising a plurality of voltage lines connected to a second flexible circuit boards among the plurality of flexible circuit boards, a main circuit board including a controller that generates the power source voltage and applying the power source voltage to each of the first source circuit board and the second source circuit board, and a connector connecting the first source circuit board and the second source circuit board. The connector is electrically connected to a first voltage line that is the most adjacent to the second source circuit board among the voltage lines of the first source circuit board and a second voltage line that is the most adjacent to the first source circuit board among the voltage lines of the second source circuit board. The connector includes a first connection portion connected to the first voltage line disposed on the first source circuit board, a second connection portion connected to the second voltage line disposed on the second source circuit board, and a resistor portion disposed between the first connection portion and the second connection portion, and the resistor portion has a relatively higher resistance than the first connection portion and the second connection portion.

The resistor portion includes a same material as the first connection portion and the second connection portion.

The resistor portion includes a predetermined pattern having a curved shape.

The resistor portion has a pattern having a zigzag shape.

The resistor portion includes a different material from the first connection portion and the second connection portion.

The connector includes a plurality of connection portions extending in the first direction and arranged in a second direction crossing the first direction to be spaced apart from each other and a resistor portion disposed at at least one of the connection portions.

The main circuit board includes a first main line connecting the controller to the first source circuit board and a second main line connecting the controller to the second source circuit board, and the first main line has a length that is different from a length of the second main line.

The driver further includes a first connection board connecting the main circuit board to the first source circuit board and a second connection board connecting the main circuit board to the second source circuit board.

The first main line is connected to the first voltage line through the first connection board, and the second main line is connected to the second voltage line through the second connection board.

Embodiments of the inventive concept provide a display device including a display panel comprising a plurality of pixels and a plurality of display pads connected to the plurality of pixels and arranged in a first direction to be spaced apart from each other and a driver applying a power source voltage to the plurality of pixels. The driver includes a plurality of flexible circuit boards connected to the plurality of display pads, a first source circuit board comprising a plurality of voltage lines connected to a first flexible circuit boards among the plurality of flexible circuit boards, a second source circuit board arranged in the first direction with the first source circuit board, spaced apart from the first source circuit board in the first direction, and comprising a plurality of voltage lines connected to a second flexible circuit boards among the plurality of flexible circuit boards, a main circuit board including a controller that generates the power source voltage, a first main line connecting the controller to the first source circuit board, and a second main line connecting the controller to the second source circuit board and a connector electrically connected to one voltage line among the voltage lines of the first source circuit board and one voltage line, which is the most adjacent to the one voltage line of the first source circuit board among the voltage lines of the second source circuit board. The first main line has a length different from a length of the second main line.

The connector includes a first connection portion connected to the first voltage line disposed on the first source circuit board, a second connection portion connected to the second voltage line disposed on the second source circuit board, and a resistor portion disposed between the first connection portion and the second connection portion, and the resistor portion has a relatively higher resistance than the first connection portion and the second connection portion.

The resistor portion includes the same material as the first connection portion and the second connection portion.

The resistor portion includes a predetermined pattern having a curved shape.

The resistor portion includes a pattern having a zigzag shape.

The resistor portion includes a different material from the first connection portion and the second connection portion.

The connector includes a plurality of connection portions extending in the first direction and arranged in a second direction crossing the first direction to be spaced apart from each other and a resistor portion disposed at at least one of the connection portions.

The driver further includes a first connection board connecting the main circuit board to the first source circuit board and a second connection board connecting the main circuit board to the second source circuit board.

The first main line is connected to the first voltage line through the first connection board, and the second main line is connected to the second voltage line through the second connection board.

Each of the first source circuit board and the second source circuit board is provided in plural, and a connector is connected between adjacent first source circuit boards and between adjacent second source circuit boards.

According to the above, as the display device includes the connector connecting the circuit boards that receive the same power source voltage, the difference between the power source voltages caused by a voltage drop may be compensated, and thus, heat generation of the display device may be reduced.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

In the present disclosure, it will be understood that when an element or layer is referred to as being "on", "connected to" or "coupled to" another element or layer, it can be directly on, connected or coupled to the other element or layer or intervening elements or layers may be present.

Like numerals refer to like elements throughout. In the drawings, the thickness, ratio, and dimension of components are exaggerated for effective description of the technical content.

As used herein, the term "and/or" may include any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "may include" and/or "including", when used in this specification, specify the presence of stated features, integers, steps, operations, elements, and/or components, but do not preclude the presence or addition of one or more other features, integers, steps, operations, elements, components, and/or groups thereof. Hereinafter, the present disclosure will be explained in detail with reference to the accompanying drawings.

Figure 1:
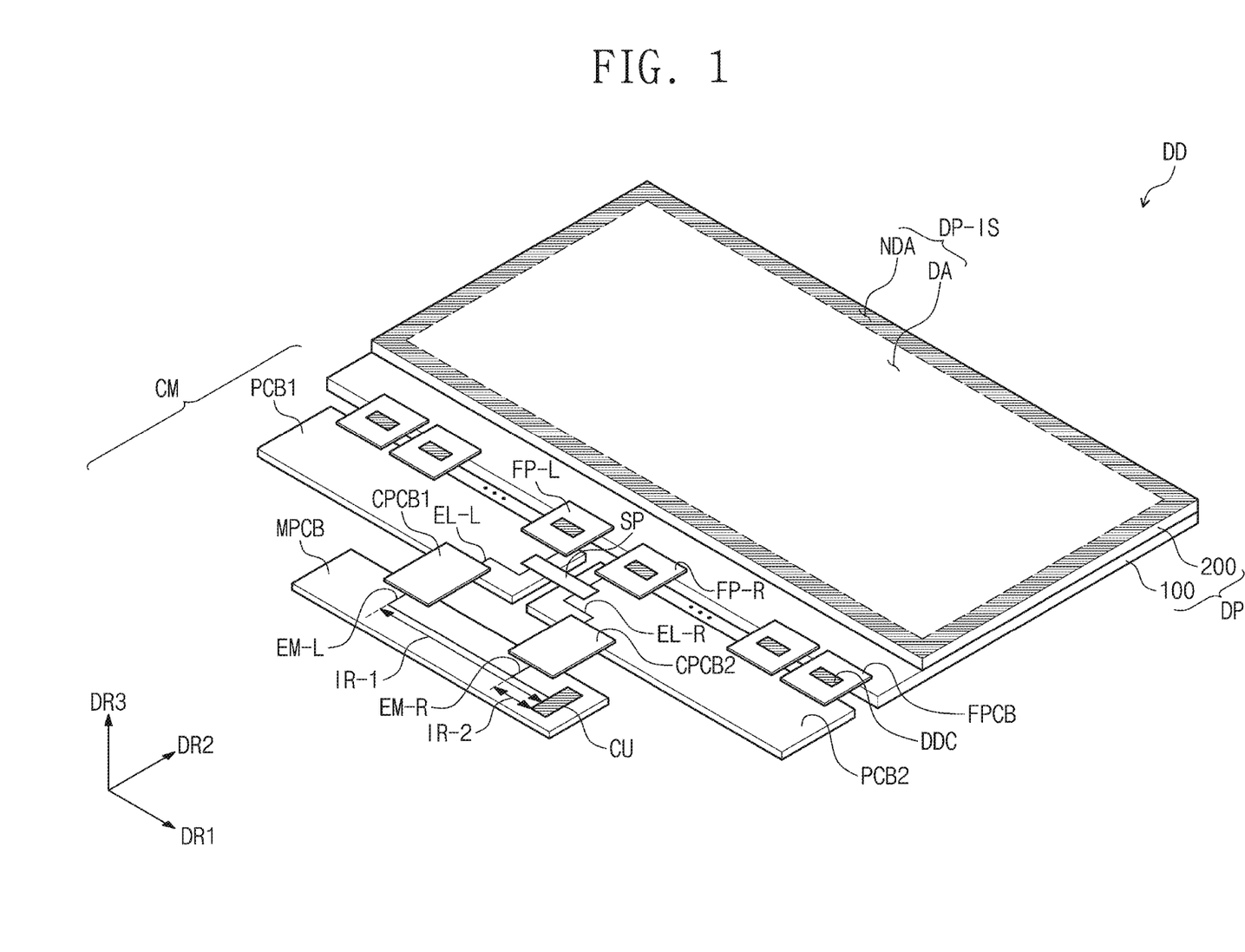
FIG. 1 is a perspective view showing a display panel according to an exemplary embodiment of the present disclosure.
Figure 2:
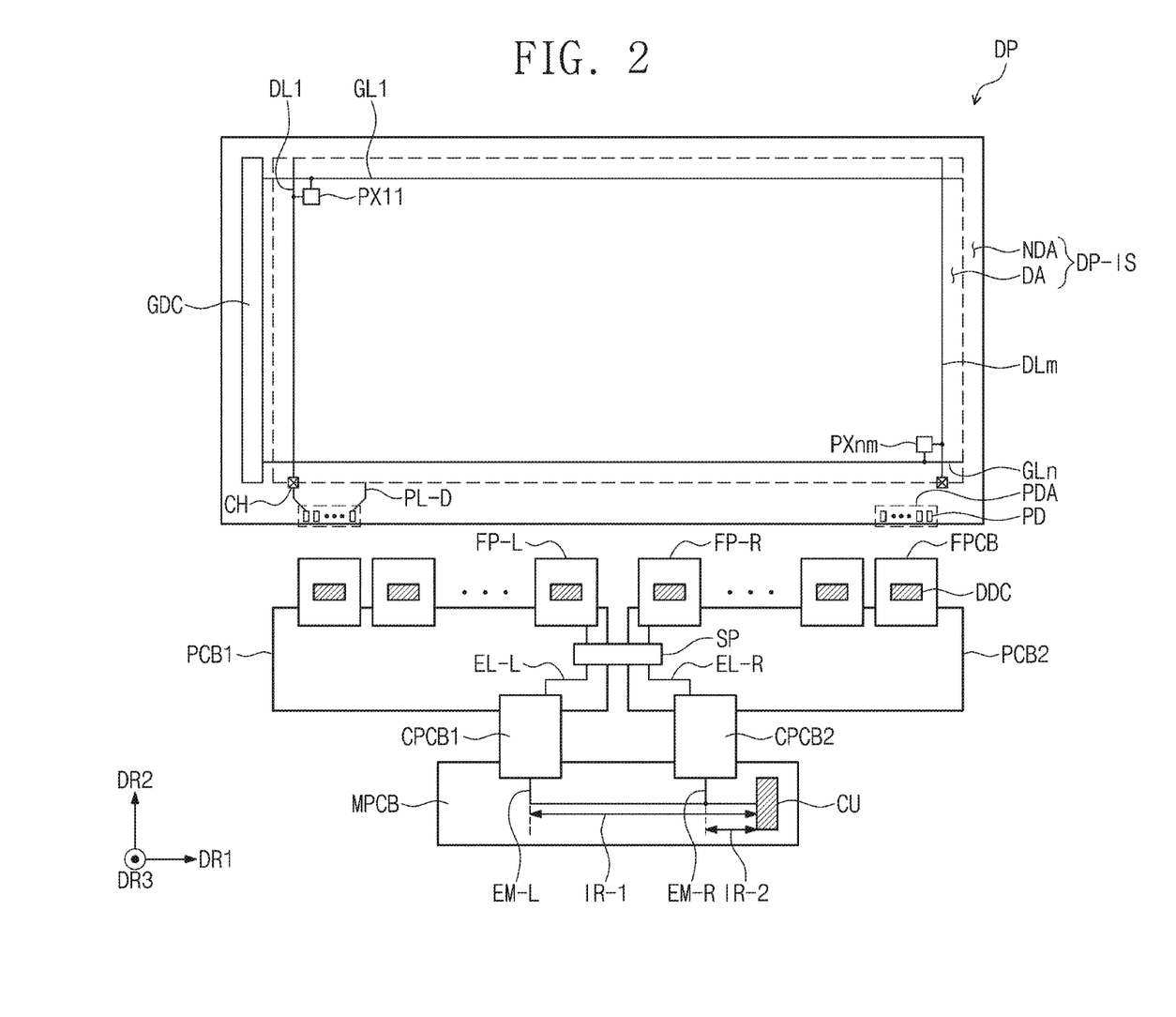
FIG. 2 is a plan view showing the display panel shown in FIG. 1 before flexible circuit boards is attached to display pad areas.
Figure 3:
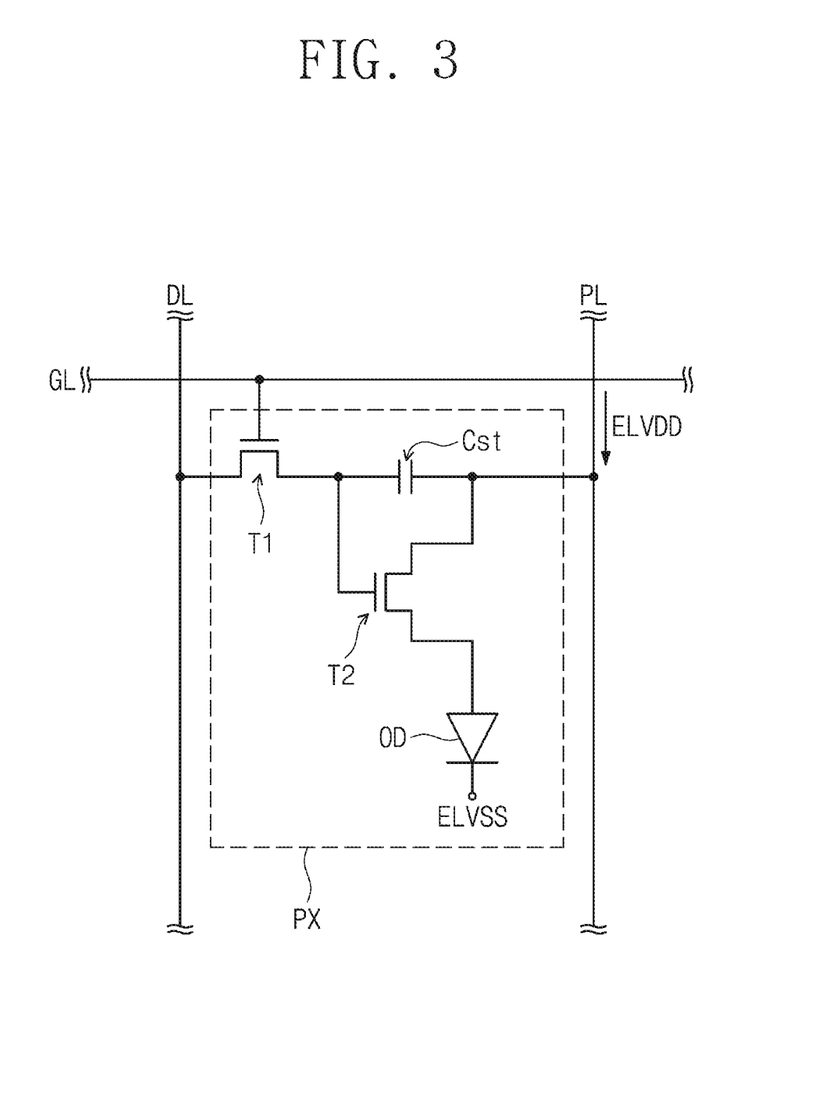
FIG. 3 is an equivalent circuit diagram showing a pixel according to an exemplary embodiment of the present disclosure.
Figure 4:
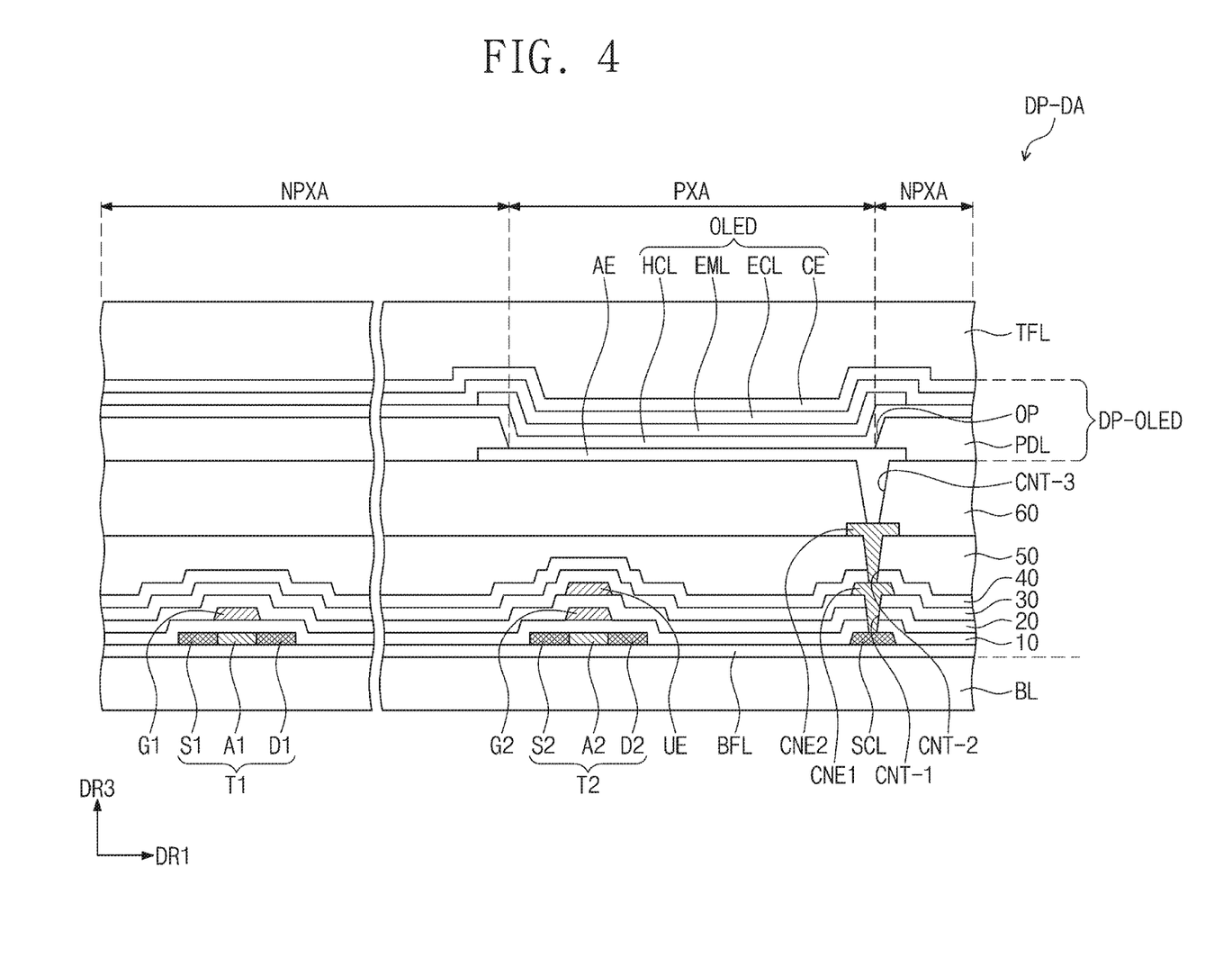
FIG. 4 is a cross-sectional view showing a pixel of a display panel according to an exemplary embodiment of the present disclosure.
Figure 5A:
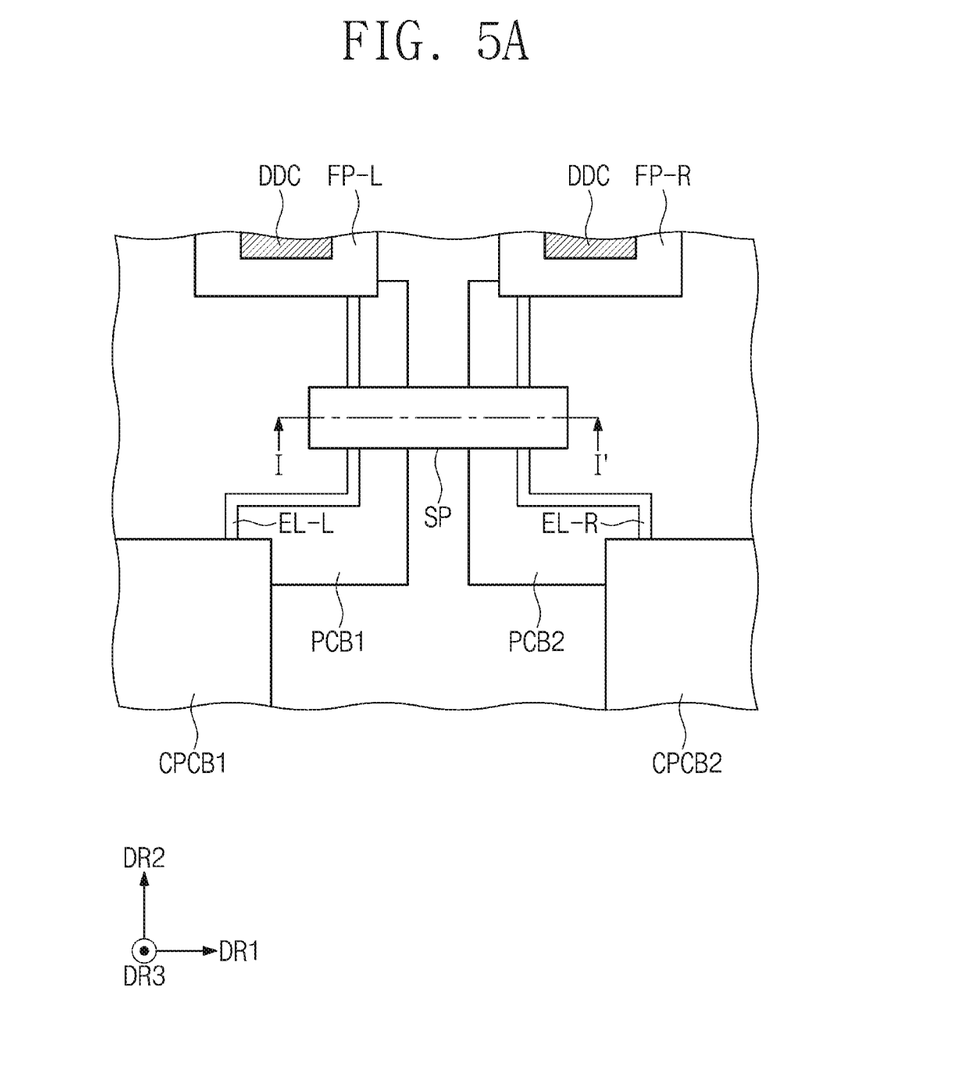
FIG. 5A is an enlarged plan view showing a display panel according to an exemplary embodiment of the present disclosure.
Figure 5B:
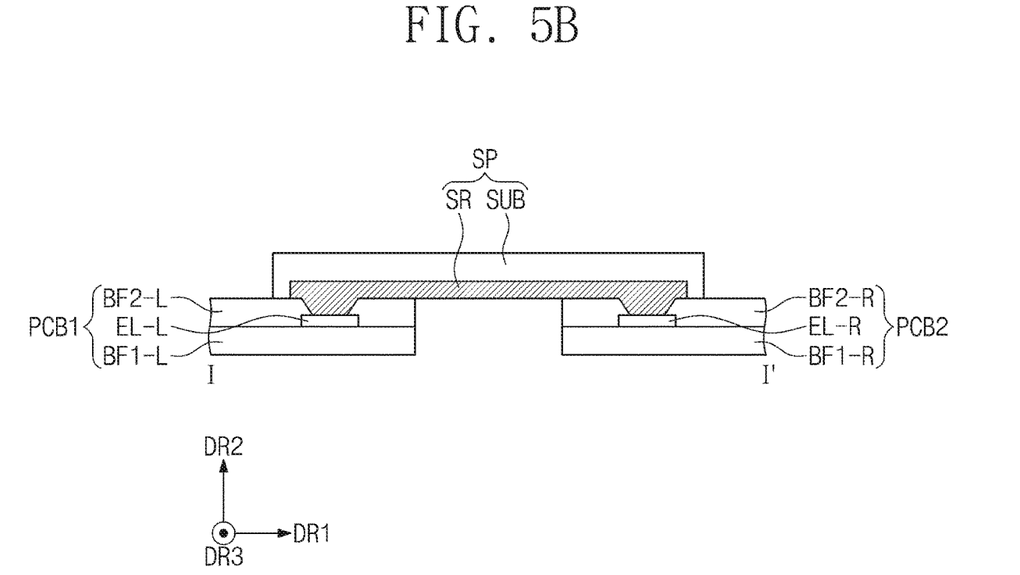
FIG. 5B is cross-sectional view taken along a line I-I' shown in FIG. 5A.

FIG. 1 is a perspective view showing a display panel according to an exemplary embodiment of the present disclosure. FIG. 2 is a plan view showing the display panel shown in FIG. 1. FIG. 3 is an equivalent circuit diagram showing a pixel according to an exemplary embodiment of the present disclosure. FIG. 4 is a cross-sectional view showing a pixel of a display panel according to an exemplary embodiment of the present disclosure. FIG. 5A is an enlarged plan view showing a display panel according to an exemplary embodiment of the present disclosure. FIG. 5B is cross-sectional view taken along a line I-I' shown in FIG. 5A.

Referring to FIGS. 1 and 2, the display device DD may include a display panel DP and a driver CM. In the present exemplary embodiment, the driver CM may include flexible circuit boards FPCB, source circuit boards PCB1 and PCB2, a main circuit board MPCB, and connection boards CPCB1 and CPCB2.

Although not shown separately, the display device DD may further include an accommodation member and may further include a backlight unit according to the type of the display panel DP.

The display panel DP may be a liquid crystal display panel, a plasma display panel, an electrophoretic display panel, a microelectromechanical system (MEMS) display panel, an electrowetting display panel, or an organic light emitting display panel, however, it should not be particularly limited.

The display panel DP may include a first display substrate 100 and a second display substrate 200. The second display substrate 200 may be disposed on the first display substrate 100. A grayscale display layer may be disposed between the first display substrate 100 and the second display substrate 200 to generate an image. The grayscale display layer may be a liquid crystal layer, an organic light emitting layer, or an electrophoretic layer.

As shown in FIG. 1, the display panel DP may display the image through a display surface DP-IS. The display surface DP-IS may be substantially parallel to a plane defined by a first directional axis DR1 and a second directional axis DR2. The display surface DP-IS may include a display area DA and a non-display area NDA. The non-display area NDA may be disposed along an edge of the display surface DP-IS. The display area DA may be surrounded by the non-display area NDA.

FIG. 1 shows the non-display area NDA surrounding the display area DA, however, they should not be limited thereto or thereby, and the non-display area NDA may be disposed on only one side area adjacent to the driver CM.

A third directional axis DR3 may indicate a normal line direction of the display surface DP-IS, i.e., a thickness direction of the display panel DP. In the present exemplary embodiment, front (or upper) and rear (or lower) surfaces of each member may be distinguished from each other with respect to the third directional axis DR3. However, the first, second, and third directional axes DR1, DR2, and DR3 are merely exemplary. Hereinafter, first, second, and third directions may be defined by the first, second, and third directional axes DR1, DR2, and DR3, respectively, and may be assigned with the same reference numerals as the first, second, and third directional axes DR1, DR2, and DR3.

In the exemplary embodiment of the present disclosure, the display panel DP includes the flat display surface DP-IS, however, it should not be limited thereto or thereby. The display device DD may include a curved display surface or a three-dimensional display surface. The three-dimensional display surface may include a plurality of display areas that face different directions from each other.

One ends of the flexible circuit boards FPCB may be connected to the display panel DP by a conductive adhesive. The conductive adhesive may include an anisotropic conductive film (ACF). Hereinafter, the anisotropic conductive film (ACF) will be described as the conductive adhesive.

In the present exemplary embodiment, The flexible circuit boards FPCB may be arranged in the first direction DR1 to be spaced apart from each other. Each of the flexible circuit boards FPCB may be connected to corresponding pads PD on a display pad area PDA.

In the present exemplary embodiment, the display pad area PDA is disposed on the first display substrate 100, however, the present disclosure should not be limited thereto or thereby. According to another exemplary embodiment of the present disclosure, the display pad area PDA may be disposed on the second display substrate 200.

Each of the flexible circuit boards FPCB may include a driving circuit mounted thereon to drive the display panel DP, e.g., a data driving circuit DDC. The data driving circuit DDC may be mounted on each of the flexible circuit board FPCB in a chip-on-film (COF) method.

In addition, the number of the data driving circuits DDC and the flexible circuit boards FPCB may be changed depending on a resolution of the display panel DP, a size of the display panel DP, and a specification of the data driving circuit DDC.

The main circuit board MPCB may include a controller CU and a plurality of main lines transmitting signals generated by the controller CU to the connection boards CPCB1 and CPCB2.

The controller CU may include a timing controller and a power supply. The controller CU may receive a control signal, image data, and an external power from the outside of the display device DD. The control signal may include a vertical synchronization signal as a frame distinction signal, a horizontal synchronization signal as a row distinction signal, a data enable signal maintained to indicate a data input period, and a main clock signal.

The timing controller may generate a gate control signal and a data control signal. The timing controller may output the gate control signal to a gate driving circuit GDC described later and may output the data control signal to the data driving circuit DDC. The timing controller may convert the image data into image data appropriate to the specification of the data driving circuit DDC and may output the converted image data to the data driving circuit DDC. The power supply may generate powers necessary for the operation of the display device DD using the external power. In addition, the power supply may generate power source voltages ELVSS and ELVDD to drive the pixel PX.

FIGS. 1 and 2 show a common line connected to the controller CU, a first main line EM-L connecting the common line to the first connection board CPCB1 to provide the power source voltages ELVSS and ELVDD generated by the controller CU to the first connection board CPCB1 and a second main line EM-R connecting the common line to the second connection board CPCB2 to provide the power source voltages ELVSS and ELVDD generated by the controller CU to the second connection board CPCB2. The first main line EM-L and the second main line EM-R may be connected to the controller CU through the common line. Accordingly, the first main line EM-L and the second main line EM-R may have different lengths IR-1 and IR-2 from each other. For example, the length of the first main line EM-L connected to the first connection board CPCB1 may be longer than the length of the second main line EM-R connected to the second connection board CPCB2.

The source circuit boards PCB1 and PCB2 may be connected to the other ends of the flexible circuit boards FPCB. The source circuit boards PCB1 and PCB2 may include insulating films and conductive lines disposed between the insulating films.

In the present disclosure, conductive lines that receive the power source voltages ELVSS and ELVDD from the main circuit board MPCB among the conductive lines of the source circuit boards PCB1 and PCB2 may be defined as voltage lines. In FIGS. 1 and 2, a first voltage line EL-L disposed in the first source circuit board PCB1 and a second voltage line EL-R disposed in the second source circuit board PCB2 are shown as a representative example.

One ends of the connection boards CPCB1 and CPCB2 may be connected to the source circuit boards PCB1 and PCB2, and the other ends of the connection boards CPCB1 and CPCB2 may be connected to the main circuit board MPCB. The connection boards CPCB1 and CPCB2 may provide the signals provided from the controller CU of the main circuit board MPCB to the source circuit boards PCB1 and PCB2. The shape and the number of connection boards CPCB1 and CPCB2 should not be particularly limited as long as the connection boards CPCB1 and CPCB2 electrically connect main circuit board and source circuit boards spaced apart from each other. For example, the connection boards CPCB1 and CPCB2 may further include source circuit boards (not shown) which are arranged in the first direction DR1 to be spaced apart from each other and connects the main circuit board MPCB to the source circuit boards (not shown). For example, source circuit boards adjacent to the first source circuit board PCB1 may be connected to the first source circuit board PCB1 through a connecter disposed between the source circuit boards. In this case, the source circuit boards adjacent to the first source circuit board PCB1 may receive a signal that is the same as the signal transmitted to the first source circuit board PCB1 from the main circuit board MPCB. In addition, source circuit boards adjacent to the second source circuit board PCB2 may be connected to the second source circuit board PCB2 through a connecter disposed between the source circuit boards. In this case, the source circuit boards adjacent to the second source circuit board PCB2 may receive a signal that is the same as the signal transmitted to the second source circuit board PCB2 from the main circuit board MPCB.

In addition, according to another exemplary embodiment, the connection boards CPCB1 and CPCB2 may be omitted, and in this case, the main circuit board MPCB may make direct contact with the source circuit boards PCB1 and PCB2.

A connector SP may be disposed between the source circuit boards PCB1 and PCB2 spaced apart from each other and may electrically connect the source circuit boards PCB1 and PCB2. In the present disclosure, the connector SP may electrically connect the first voltage line EL-L that is the most adjacent to the second source circuit board PCB2 among the voltage lines of the first source circuit board PCB1 and the second voltage line EL-R that is the most adjacent to the first source circuit board PCB1 among the voltage lines of the second source circuit board PCB2.

In the present disclosure, the first voltage line EL-L may be the line that is the most adjacent to the second source circuit board PCB2 among the voltage lines included in the first source circuit board PCB1, and the second voltage line EL-R may be the line that is the most adjacent to the first source circuit board PCB1 among the voltage lines included in the second source circuit board PCB2.

In the present disclosure, a first flexible circuit board FP-L may be a flexible circuit board that is the most adjacent to the second source circuit board PCB2 among the flexible circuit boards FPCB connected to the first source circuit board PCB1, and a second flexible circuit board FP-R may be a flexible circuit board that is the most adjacent to the first source circuit board PCB1 among the flexible circuit boards FPCB connected to the second source circuit board PCB2.

Referring to FIGS. 5A and 5B, the connector SP according to the present disclosure may include a base film SUB and a conductor SR having a conductivity. The conductor SR may be disposed in the base film SUB and may have a shape in which at least a portion of the conductor SR is exposed. FIG. 5B shows a shape in which one surface of the conductor SR is entirely exposed, however, the shape of the conductor SR should not be limited thereto or thereby. That is, the conductor SR may have a shape in which some areas of the conductor SR, which overlap the first voltage line EL-L and the second voltage line EL-R, are exposed and are connected to the first voltage line EL-L and the second voltage line EL-R.

The first source circuit board PCB1 may include films BF1-L and BF2-L and voltage lines. FIG. 5B shows the first voltage line EL-L as a representative example of the voltage lines. The second source circuit board PCB2 may include films BF1-R and BF2-R and voltage lines. FIG. 5B shows the second voltage line EL-R as a representative example of the voltage lines.

The first voltage line EL-L may be exposed by a contact hole form in a second film BF2-L. A portion of the first voltage line EL-L, which is exposed by the second film BF2-L, may be connected to one end of the conductor SR. The second voltage line EL-R may be exposed by a contact hole formed in a second film BF2-R. A portion of the second voltage line EL-R, which is exposed by the second film BF2-R, may be connected to the other end of the conductor SR. Accordingly, the connector SP may be electrically connects the voltage lines EL-L and EL-R that are the most adjacent to each other among the voltage lines of the first source circuit board PCB1 and the second source circuit board PCB2.

The power source voltages ELVDD and ELVSS may be transmitted to the first flexible circuit board FP-L from the controller CU of the main circuit board MPCB through the first main line EM-L, the first connection board CPCB1, and the first voltage line EL-L.

In addition, the power source voltages ELVDD and ELVSS may be transmitted to the second flexible circuit board FP-R from the controller CU of the main circuit board MPCB through the second main line EM-R, the second connection board CPCB2, and the second voltage line EL-R.

In this case, as the power source voltages ELVDD and ELVSS generated by the controller CU and having the same voltage level are transmitted through the first main line EM-L and the second main line EM-R having the lengths IR-1 and IR-2 different from each other, different voltage drops (IR drop) caused by different resistances may be generated in the first main line EM-L and the second main line EM-R, and thus, the power source voltages ELVDD and ELVSS having different levels from each other are provided respectively to the first flexible circuit board FP-L and the second flexible circuit board FP-R. Accordingly, a heat generation phenomenon may occur on any one of the first flexible circuit board FP-L and the second flexible circuit board FP-R.

According to the present disclosure, the connector SP that electrically connects the lines that are the most adjacent to each other among the voltage lines included in the first source circuit board PCB1 and the voltage lines included in the second source circuit board PCB2 may be provided. The connector SP may form a path that allows the power source voltages ELVDD and ELVSS having different levels from each other due to the different voltage drops not to be transmitted directly to the first flexible circuit board FP-L and the second flexible circuit board FP-R and to offset the different levels of the power source voltages ELVDD and ELVSS, and thus, the heat generation phenomenon on one of the first flexible circuit board FP-L and the second flexible circuit board FP-R may be prevented.

FIG. 2 shows arrangements of signal lines GL1 to GLn, DL1 to DLm, and PL-D and pixels PX11 to PXnm in a plan view. The signal lines GL1 to GLn, DL1 to DLm, and PL-D may include a plurality of gate lines GL1 to GLn, a plurality of data lines DL1 to DLm, and auxiliary signal lines PL-D.

The gate lines GL1 to GLn may extend in the first direction DR1 and may be arranged in the second direction DR2. The data lines DL1 to DLm may be insulated from the gate lines GL1 to GLn while crossing the gate lines GL1 to GLn. The data lines DL1 to DLm may extend in the second direction DR2 and may be arranged in the first direction DR1.

The gate lines GL1 to GLn and the data lines DL1 to DLm may be disposed to overlap the display area DA. The auxiliary signal lines PL-D may be disposed to overlap the non-display area NDA and may be connected to the gate lines GL1 to GLn and the data lines DL1 to DLm.

The auxiliary signal lines PL-D connected to the data lines DL1 to DLm may be disposed on a layer different from a layer on which the data lines DL1 to DLm are disposed. The data lines DL1 to DLm may be electrically connected to corresponding signal lines among the auxiliary signal lines PL-D through a contact hole CH. The contact hole CH may be defined through at least one insulating layer disposed between the data lines DL1 to DLm and the auxiliary signal lines PL-D. FIG. 2 shows two contact holes CH as a representative example.

According to another exemplary embodiment of the present disclosure, the contact hole CH may be omitted. The data lines DL1 to DLm and the auxiliary signal lines PL-D may be disposed on the same layer. In this case, the data line and the auxiliary signal line which are connected to each other, among the data lines DL1 to DLm and the auxiliary signal lines PL-D, may be one signal line. In addition, the data line and the auxiliary signal line, which are connected to each other, may be different portions of the one signal line.

Each of the pixels PX11 to PXnm may be connected to a corresponding gate line among the gate lines GL1 to GLn and a corresponding data line among the data lines DL1 to DLm. Each of the pixels PX11 to PXnm may include a pixel driving circuit and a display element.

FIG. 2 shows the pixels PX11 to PXnm arranged in a matrix form, however, the arrangement of the pixels PX11 to PXnm should not be limited thereto or thereby. That is, the pixels PX11 to PXnm may be arranged in a pentile form or a diamond form.

As shown in FIG. 2, the pads PD may be arranged in the display pad areas PDA to be spaced apart from each other in the first direction DR1. The pads PD may be connected to the one ends of the flexible circuit board FPCB.

The gate driving circuit GDC may be integrated in the display panel DP through an oxide silicon gate driver circuit (OSG) or an amorphous silicon gate driver circuit (ASG) process.

FIG. 3 shows an equivalent circuit diagram of one pixel PX connected to one gate line GL among the gate lines GL1 to GLn, one data line DL among the data lines DL1 to DLm, and the power line PL as a representative example.

The pixel PX may include a first transistor T1, a second transistor T2, a capacitor Cst, and an organic light emitting element OD. The first transistor T1 may include an input electrode and an output electrode. The first transistor T1 may output a data signal applied to the data line DL in response to a gate signal applied to the gate line GL.

The capacitor Cst may include a first capacitor electrode connected to the first transistor T1 and a second capacitor electrode receiving a first power source voltage ELVDD.

The capacitor Cst may be charged with electric charges corresponding to a difference between a voltage corresponding to the data signal from the first transistor T1 and the first power source voltage ELVDD.

The second transistor T2 may include a control electrode connected to the output electrode of the first transistor T1 and the first capacitor electrode of the capacitor Cst, an input electrode receiving the first power source voltage ELVDD provided through the power line PL, and an output electrode. The output electrode of the second transistor T2 may be connected to the organic light emitting element OD.

The second transistor T2 may control a driving current flowing through the organic light emitting element OD in response to an amount of the electric charges charged in the capacitor Cst. A turn-on time of the second transistor T2 may be determined by the amount of the electric charges charged in the capacitor Cst. The output electrode of the second transistor T2 may apply a voltage having a voltage level lower than the first power source voltage ELVDD to the organic light emitting element OD.

The organic light emitting element OD may include a first electrode connected to the second transistor T2 and a second electrode receiving a second power source voltage ELVSS. The organic light emitting element OD may include a light emitting pattern disposed between the first electrode and the second electrode.

The organic light emitting element OD may emit light during the turn-on period of the second transistor T2. The light generated by the organic light emitting element OD may have a color determined by materials that form the light emitting pattern. For instance, the color of the light generated by the organic light emitting element OD may be one of red, green, and blue colors.

FIG. 4 is the cross-sectional view corresponding to the pixel PX of the display panel DP. Referring to FIG. 4, the display panel DP may include a plurality of insulating layers, a semiconductor pattern, a conductive pattern, and a signal line. An insulating layer, a semiconductor layer, and a conductive layer may be formed by a coating or depositing process. Then, the insulating layer, the semiconductor layer, and the conductive layer may be selectively patterned by a photolithography process. The pattern, the semiconductor pattern, the conductive pattern, and the signal line may be formed.

A base layer BL may include a synthetic resin layer. The synthetic resin layer may include a heat-curable resin. The base layer BL may have a multi-layer structure. For instance, the base layer BL may have a three-layer structure of a synthetic resin layer, an adhesive layer, and a synthetic resin layer. In particular, the synthetic resin layer may be a polyimide-based resin layer, however, a material for the synthetic resin layer should not be particularly limited. The synthetic resin layer may include at least one of an acrylic-based resin, a methacrylic-based resin, a polyisoprene, a vinyl-based resin, an epoxy-based resin, a urethane-based resin, a cellulose-based resin, a siloxane-based resin, a polyamide-based resin, and a perylene-based resin. The base layer BL may include a glass substrate, a metal substrate, or an organic/inorganic composite substrate.

At least one inorganic layer may be formed on an upper surface of the base layer BL. The inorganic layer may include at least one of aluminum oxide, titanium oxide, silicon oxide, silicon oxynitride, zirconium oxide, and hafnium oxide. The inorganic layer may be formed in multiple layers. The inorganic layers may form a barrier layer and/or a buffer layer. In the present exemplary embodiment, the display panel DP may include a buffer layer BFL.

The buffer layer BFL may increase an adhesion between the base layer BL and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include poly silicon, however, it should not be limited thereto or thereby. The semiconductor pattern may include amorphous silicon or metal oxide.

FIG. 4 shows only a portion of the semiconductor pattern, and the semiconductor pattern may be further disposed in other areas of the pixels in a plan view. The semiconductor pattern may be arranged with a specific rule over the pixels PX. The semiconductor pattern may have different electrical properties depending on doping level. The semiconductor pattern may include a heavily doped region and a non-doped region. The heavily doped region may be doped with an N-type dopant or a P-type dopant. A P-type transistor may include a heavily doped region doped with the P-type dopant.

A source S1, an active A1, and a drain D1 of the first transistor T1 may be formed from the semiconductor pattern, and a source S2, an active A2, and a drain D2 of the second transistor T2 may be formed from the semiconductor pattern. The sources S1 and S2 and the drains D1 and D2 may extend in opposite directions to each other from the actives A1 and A2.

A first insulating layer 10 may be disposed on the buffer layer BFL. The first insulating layer 10 may commonly overlap the pixels PX and may cover the semiconductor pattern. The first insulating layer 10 may be an inorganic layer and/or an organic layer and may have a single-layer or multi-layer structure. The first insulating layer 10 may include at least one of aluminum oxide, titanium oxide, silicon oxide, silicon oxynitride, zirconium oxide, and hafnium oxide. In the present exemplary embodiment, the first insulating layer 10 may have a single-layer structure of a silicon oxide layer. Not only the first insulating layer 10, but also insulating layers described later may be an inorganic layer and/or an organic layer and may have a single-layer or multi-layer structure. The inorganic layer may include at least one of the above-mentioned materials.

Gates G1 and G2 may be disposed on the first insulating layer 10. The gates G1 and G2 may be portions of a metal pattern. The gates G1 and G2 may overlap the actives A1 and A2, respectively. The gates G1 and G2 may be used as a mask in a process of doping the semiconductor pattern.

A second insulating layer 20 may be disposed on the first insulating layer 10 and may cover the gates G1 and G2. The second insulating layer 20 may commonly overlap the pixels PX. The second insulating layer 20 may be an inorganic layer and/or an organic layer and may have a single-layer or multi-layer structure. In the present exemplary embodiment, the second insulating layer 20 may have a single-layer structure of a silicon oxide layer.

An upper electrode UE may be disposed on the second insulating layer 20. The upper electrode UE may overlap the gate G2 of the second transistor T2. The upper electrode UE may be a portion of a metal pattern. A portion of the gate G2 and the upper electrode UE overlapping the portion of the gate G2 may define the capacitor Cst. According to another exemplary embodiment, the upper electrode UE may be omitted.

A third insulating layer 30 may be disposed on the second insulating layer 20 and may cover the upper electrode UE. In the present exemplary embodiment, the third insulating layer 30 may have a single-layer structure of a silicon oxide layer. A first connection electrode CNE1 may be disposed on the third insulating layer 30. The first connection electrode CNE1 may be connected to a connection signal line SCL through a contact hole CNT-1 defined through the first, second, and third insulating layers 10, 20, and 30. The connection signal line SCL may include a drain of the second transistor T2, the gate lines GL1 to GLn, the data lines DL1 to DLm, or the power line PL.

A fourth insulating layer 40 may be disposed on the third insulating layer 30 to cover the first connection electrode CNE1. The fourth insulating layer 40 may have a single-layer structure of a silicon oxide layer. A fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 defined through the fourth insulating layer 40 and the fifth insulating layer 50.

A sixth insulating layer 60 may be disposed on the fifth insulating layer 50 and may cover the second connection electrode CNE2. The sixth insulating layer 60 may be an organic layer. A first electrode AE may be disposed on the sixth insulating layer 60. The first electrode AE may be connected to the second connection electrode CNE2 through a contact hole CNT-3 defined through the sixth insulating layer 60. An opening OP may be defined through a pixel definition layer PDL. At least a portion of the first electrode AE may be exposed through the opening OP of the pixel definition layer PDL.

A display area DP-DA may include a light emitting area PXA and a non-light-emitting area NPXA defined adjacent to the light emitting area PXA. The non-light-emitting area NPXA may surround the light emitting area PXA. In the present exemplary embodiment, the light emitting area PXA may be defined to correspond to the portion of the first electrode AE exposed through the opening OP.

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the opening OP. That is, the light emitting layer EML may be formed in each of the pixels PX.

An electron control layer ECL may be disposed on the light emitting layer EML. The electron control layer ECL may include an electron transport layer and may further include an electron injection layer. The hole control layer HCL and the electron control layer ECL may be commonly formed in the plural pixels using an open mask. A second electrode CE may be disposed on the electron control layer ECL. The second electrode CE may have an integral shape and may be commonly disposed in the pixels PX.

An upper insulating layer TFL may be disposed on the second electrode CE. The upper insulating layer TFL may include a plurality of thin layers. The upper insulating layer TFL may include a capping layer and a thin film encapsulation layer. The thin film encapsulation layer may include a plurality of inorganic layers and an organic layer disposed between the inorganic layers. The inorganic layers may be silicon nitride layers, silicon oxynitride layers, or silicon oxide layers. The organic layer may include an acrylic-based organic layer, however, it should not be limited thereto or thereby.

The inorganic layers may protect an organic light emitting diode OD from moisture/oxygen, and the organic layer may protect the organic light emitting diode OD from a foreign substance such as dust particles.

The capping layer TFL may be disposed on the second electrode CE and may make contact with the second electrode CE. The capping layer TFL may include an organic material. The capping layer TFL may protect the second electrode CE from the following process, e.g., a sputtering process, and may improve a light emission efficiency of the organic light emitting diode OD.

Figure 6:
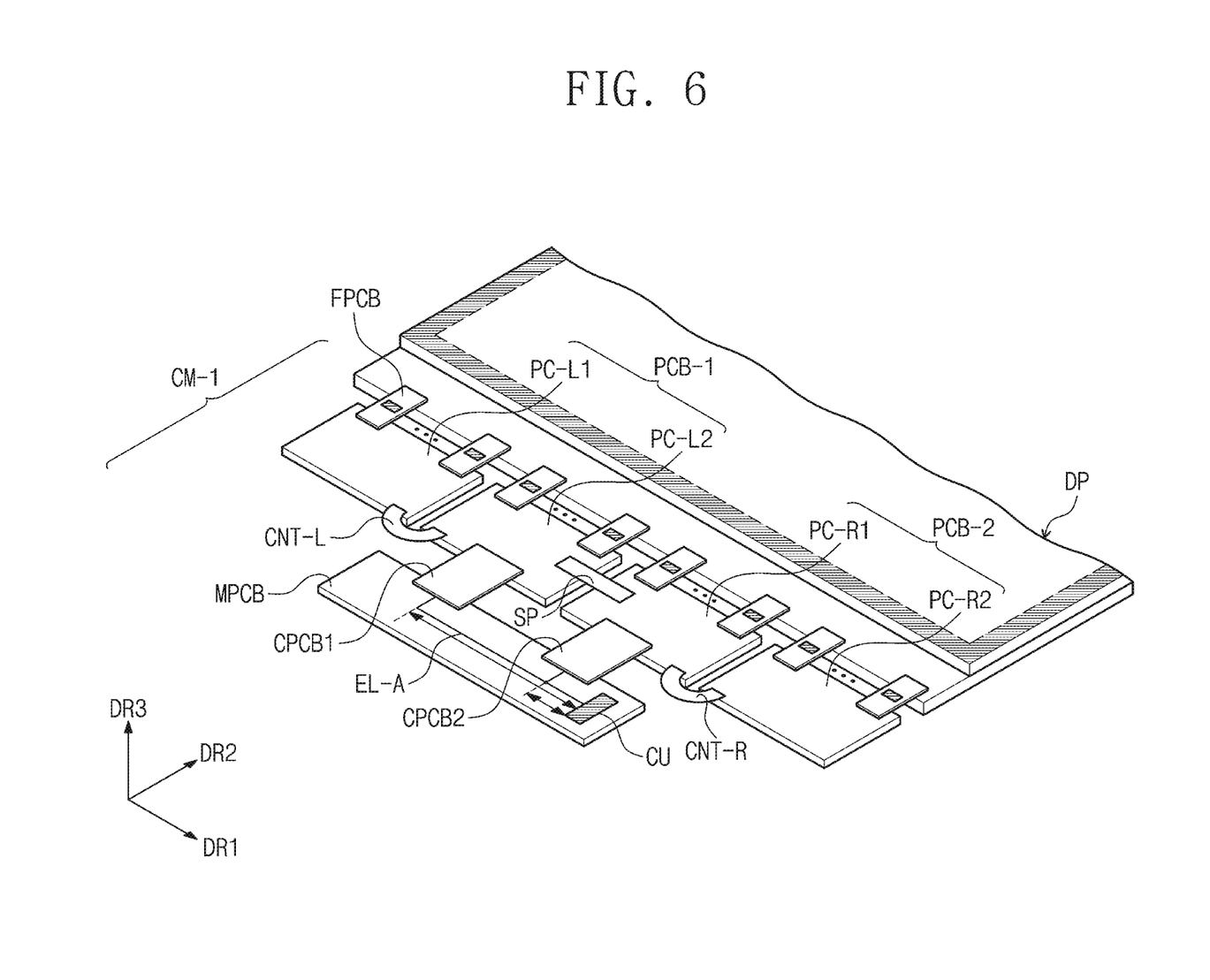
FIG. 6 is a perspective view showing a display panel according to an exemplary embodiment of the present disclosure.

FIG. 6 is a perspective view showing a display panel according to an exemplary embodiment of the present disclosure. In FIG. 6, the same reference numerals denote the same elements in FIGS. 1 to 5B, and thus, detailed descriptions of the same elements will be omitted.

A driver CM-1 according to the present exemplary embodiment may include flexible circuit boards FPCB connected to the display panel DP, source circuit boards PCB-1 and PCB-2 connected to the flexible circuit boards FPCB, connection boards CPCB1 and CPCB2 connected to the source circuit boards PCB-1 and PCB-2, a main circuit board MPCB connected to the connection boards CPCB1 and CPCB2, and a connector SP connecting the source circuit boards PCB-1 and PCB-2 adjacent to each other.

In the present exemplary embodiment, the driver CM-1 may further include a connector CNT-L connecting adjacent first sub-boards PC-L1 and PC-L2 in the first source circuit board PCB-1 and a connector CNT-R connecting adjacent second sub-boards PC-R1 and PC-R2 in the second source circuit board PCB-2.

In the present exemplary embodiment, the first source circuit board PCB-1 may include first sub-boards PC-L1 and PC-L2. The first sub-boards PC-L1 and PC-L2 may equally receive a first signal generated by a controller CU through a main line EL-A.

The second source circuit board PCB-2 may include second sub-boards PC-R1 and PC-R2. The second sub-boards PC-R1 and PC-R2 may equally receive a second signal generated by the controller CU through the main line EL-A. The first signal and the second signal, which are respectively applied to the first source circuit board PCB-1 and the second source circuit board PCB-2, may be the same as each other or different from each other.

According to the present exemplary embodiment, the first sub-boards PC-L1 and PC-L2 may be arranged in the first direction DR1 to be spaced apart from each other. A first connector CNT-L may electrically connect the first sub-boards PC-L1 and PC-L2 spaced apart from each other. The connection method between the first connector CNT-L and the first sub-boards PC-L1 and PC-L2 should not be particularly limited as long as the first sub-boards PC-L1 and PC-L2 are electrically connected to each other.

In addition, the second sub-boards PC-R1 and PC-R2 may be arranged in the first direction DR1 to be spaced apart from each other. A second connector CNT-R may electrically connect the second sub-boards PC-R1 and PC-R2 spaced apart from each other. The connection method between the second connector CNT-R and the second sub-boards PC-R1 and PC-R2 should not be particularly limited as long as the second sub-boards PC-R1 and PC-R2 are electrically connected to each other. In FIG. 6, the source circuit board PCB-1 includes two sub-boards PC-L1 and PC-L2, and the source circuit board PCB-2 includes two sub-boards PC-R1 and PC-R2, however, they should not be limited thereto or thereby. The number of the sub-boards included in the source circuit boards PCB-1 and PCB-2 and the number of the connectors connecting the sub-boards may be changed depending on a resolution of the display panel DP, a size of the display panel DP, and a specification of the data driving circuit DDC (refer to FIG. 5A).

Figure 7:
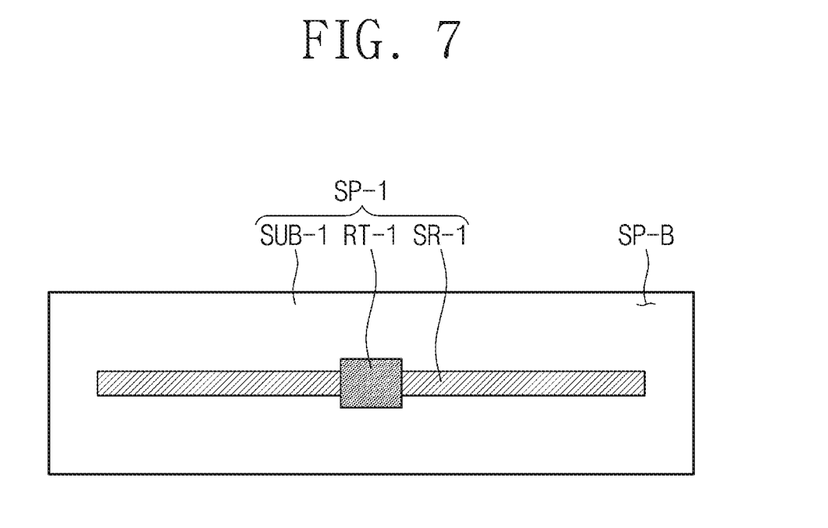
FIG. 7 is a plan view showing a resistor according to an exemplary embodiment of the present disclosure.
Figure 8:
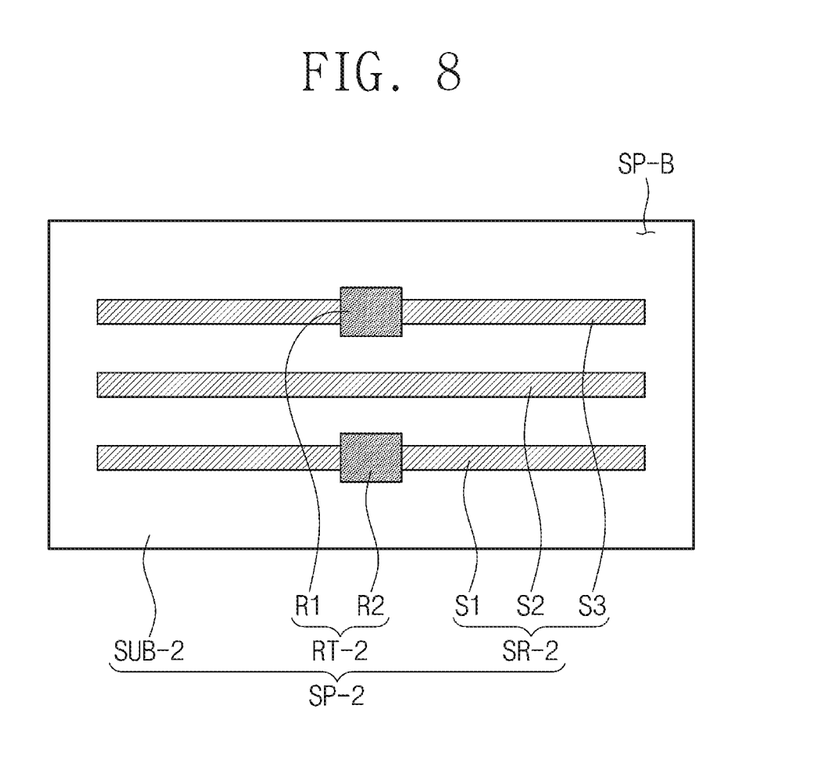
FIG. 8 is a plan view showing a connector according to an exemplary embodiment of the present disclosure.
Figure 9:
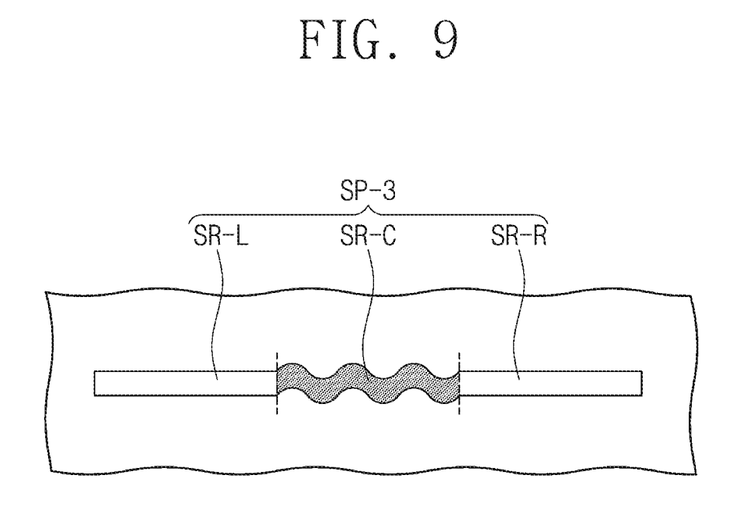
FIG. 9 is a plan view showing a connector according to an exemplary embodiment of the present disclosure.
Figure 10:
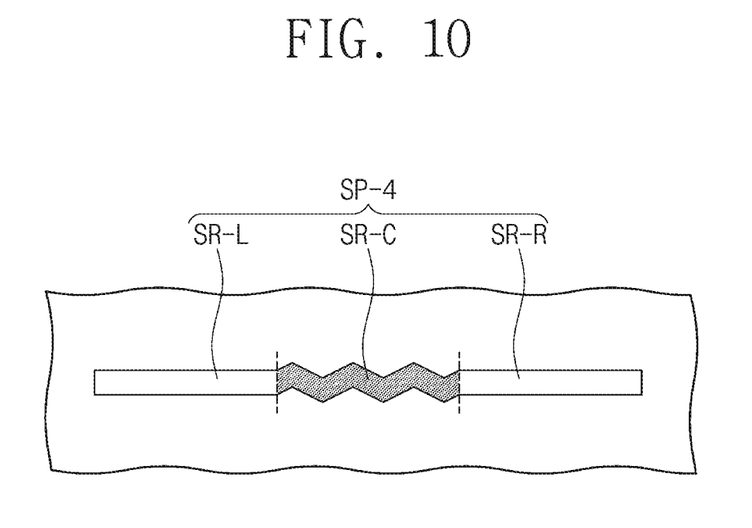
FIG. 10 is a plan view showing a connector according to an exemplary embodiment of the present disclosure.
Figure 11:
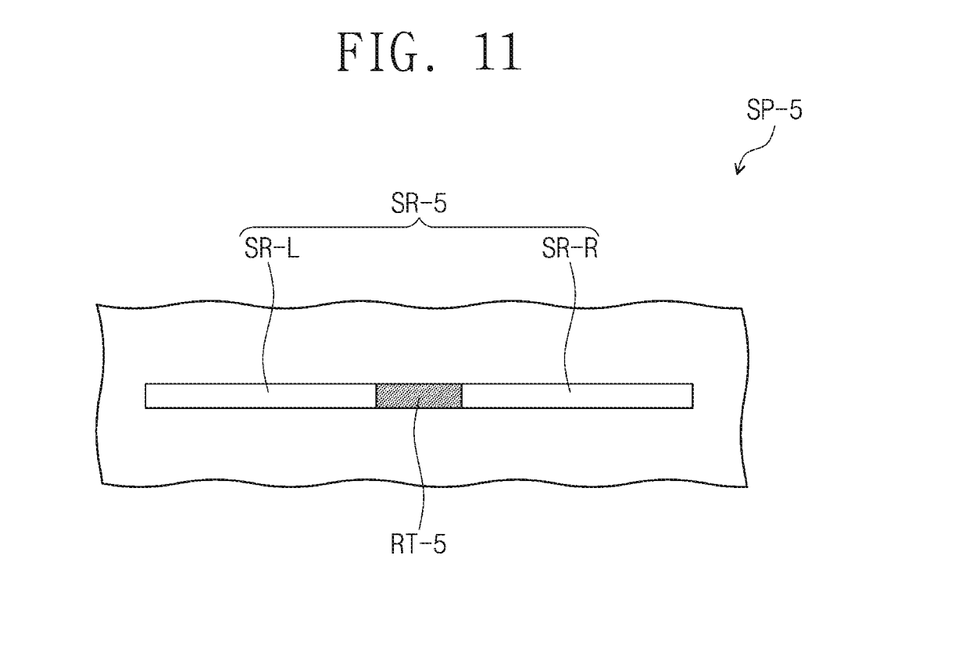
FIG. 11 is a plan view showing a connector according to an exemplary embodiment of the present disclosure.
Figure 12:
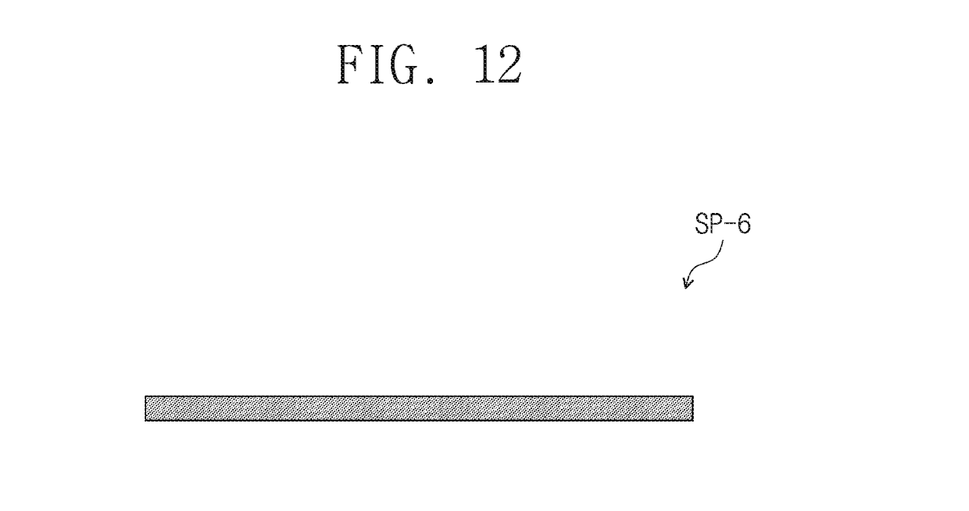
FIG. 12 is a plan view showing a connector according to an exemplary embodiment of the present disclosure.

FIG. 7 is a plan view showing a connector according to an exemplary embodiment of the present disclosure. FIG. 8 is a plan view showing a connector according to an exemplary embodiment of the present disclosure. FIG. 9 is a plan view showing a connector according to an exemplary embodiment of the present disclosure. FIG. 10 is a plan view showing a connector according to an exemplary embodiment of the present disclosure. FIG. 11 is a plan view showing a connector according to an exemplary embodiment of the present disclosure. FIG. 12 is a plan view showing a connector according to an exemplary embodiment of the present disclosure. Hereinafter, descriptions on the connector, which will be described in FIGS. 7 to 12, may be applied to the connector described with reference to FIGS. 1 to 6. In FIGS. 7 to 12, the same/similar reference numerals denote the same/similar elements in FIGS. 1 to 6, and thus, detailed descriptions of the same elements will be omitted. Hereinafter, a type and a material of a base film, which will be described with reference to FIGS. 7 to 11, should not be particularly limited as long as it is a base layer on which a conductive material may be disposed. In addition, one end of a connector, which will be described with reference to FIGS. 7 to 11, may be connected to the first voltage line EL-L (refer to FIG. 1), and the other end of the connector may be connected to the second voltage EL-R (refer to FIG. 1).

Referring to FIG. 7, a connector SP-1 according to the present exemplary embodiment may include a base film SUB-1, a connection portion SR-1 having a conductivity, and a resistor portion RT-1. The resistor portion RT-1 may have a resistance higher than that of the connection portion SR-1. The resistor portion RT-1 should not be particularly limited as long as the resistor portion RT-1 is implemented by a passive element (resistor, capacitor, inductor) or includes a material that is different from the connection portion SR-1 and has a higher resistance than the connection portion SR-1.

In FIG. 7, the connection portion SR-1 and the resistor portion RT-1 are exposed on a rear surface SP-B of the connector SP-1, however, they should not be limited thereto or thereby. That is, only a portion of the connection portion SR-1, which is connected to the source circuit boards PCB1 and PCB2, may be exposed, and the other portion of the connection portion SR-1 and the resistor portion RT-1 may be provided to be covered by an insulating layer.

Referring to FIG. 8, a connector SP2 according to the present exemplary embodiment may include a base film SUB-2, a connection portion SR-2 having a conductivity, and a resistor portion RT-2.

The connection portion SR-2 may include first, second, and third connection portions S1, S2, and S3 extending in one direction and arranged in a direction crossing the one direction to be spaced apart from each other.

The resistor portion RT-2 may have a relatively higher resistance than that of the connection portion SR-2. The resistor portion RT-2 should not be particularly limited as long as the resistor portion RT-2 is implemented by a passive element or includes a material that is different from the connection portion SR-2 and has a higher resistance than the connection portion SR-2.

In the present exemplary embodiment, the resistor portion RT-2 may include a plurality of resistors R1 and R2 connected to at least one of the first, second, and third connection portions S1, S2, and S3.

Referring to FIG. 9, a connector SP-3 according to the present exemplary embodiment may include a first connection portion SR-L, a second connection portion SR-R, and a resistor portion SR-C, which have a conductivity.

In the present exemplary embodiment, the first connection portion SR-L, the second connection portion SR-R, and the resistor portion SR-C may include the same material. The resistor portion SR-C may be disposed between the first connection portion SR-L and the second connection portion SR-R. The first connection portion SR-L, the resistor portion SR-C, and the second connection portion SR-R may be provided integrally with each other, however, they will be described separately for the convenience of explanation.

The resistor portion SR-C may include a predetermined pattern. For example, the resistor portion SR-C may include the pattern having a predetermined curve. Accordingly, although the first connection portion SR-L, the second connection portion SR-R, and the resistor portion SR-C are formed of the same material, the resistor portion SR-C having the predetermined pattern may have a relatively longer length than that of the first connection portion SR-L and the second connection portion SR-R in an allocated area, and thus, the resistor portion SR-C may serve as a resistor.

Referring to FIG. 10, a connector SP-4 according to the present exemplary embodiment may include a first connection portion SR-L, a second connection portion SR-R, and a resistor portion SR-C, which have a conductivity.

In the present exemplary embodiment, the first connection portion SR-L, the second connection portion SR-R, and the resistor portion SR-C may include the same material. The resistor portion SR-C may be disposed between the first connection portion SR-L and the second connection portion SR-R. The first connection portion SR-L, the resistor portion SR-C, and the second connection portion SR-R may be provided integrally with each other, however, they will be described separately for the convenience of explanation.

The resistor portion SR-C may include a predetermined pattern. For example, the resistor portion SR-C may include the pattern having a zigzag shape. Accordingly, although the first connection portion SR-L, the second connection portion SR-R, and the resistor portion SR-C are formed of the same material, the resistor portion SR-C having the predetermined pattern may have a relatively longer length than that of the first connection portion SR-L and the second connection portion SR-R in an allocated area, and thus, the resistor portion SR-C may serve as a resistor.

Referring to FIG. 11, a connector SP-5 according to the present exemplary embodiment may include a first connection portion SR-L, a second connection portion SR-R, and a resistor portion RT-5, which have a conductivity.

In the present exemplary embodiment, the first connection portion SR-L, the second connection portion SR-R, and the resistor portion RT-5 may include different materials from each other. The resistor portion RT-5 may be disposed between the first connection portion SR-L and the second connection portion SR-R.

In the present exemplary embodiment, the resistor portion RT-5 may include a material having a relatively higher resistance than that of the first connection portion SR-L and the second connection portion SR-R. For example, when the first connection portion SR-L and the second connection portion SR-R include a metal material, the resistor portion RT-5 may include a metal material having a relatively higher resistance than that of the first connection portion SR-L and the second connection portion SR-R. Accordingly, the resistor portion RT-5 may serve as a resistor between the first connection portion SR-L and the second connection portion SR-R.

Referring to FIG. 12, a connector SP-6 may have a conductivity different from the connectors of FIGS. 7 to 11 and may be provided in the form of a wire from which a base film is removed. The shape and the number of the connectors SP-6 should not be particularly limited as long as the resistors SP-6 are provided in the form of wire.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

What is claimed is:

1. A display device comprising:
   a display panel comprising a plurality of pixels and a plurality of display pads connected to the plurality of pixels and arranged in a first direction to be spaced apart from each other; and
   a driver applying a power source voltage to the plurality of pixels, the driver comprising:
      a plurality of flexible circuit boards connected to the plurality of display pads;
      a first source circuit board comprising a plurality of voltage lines connected to a first flexible circuit boards among the plurality of flexible circuit boards;
      a second source circuit board arranged in the first direction with the first source circuit board, spaced apart from the first source circuit board in the first direction, and comprising a plurality of voltage lines connected to a second flexible circuit boards among the plurality of flexible circuit boards;
      a main circuit board comprising a controller that generates the power source voltage and applying the power source voltage to each of the first source circuit board and the second source circuit board; and
      a connector connecting the first source circuit board and the second source circuit board, wherein the connector is electrically connected to a first voltage line that is the most adjacent to the second source circuit board among the voltage lines of the first source circuit board and a second voltage line that is the most adjacent to the first source circuit board among the voltage lines of the second source circuit board.

2. The display device of claim 1, wherein the connector comprises:
   a first connection portion connected to the first voltage line disposed on the first source circuit board;
   a second connection portion connected to the second voltage line disposed on the second source circuit board; and
   a resistor portion disposed between the first connection portion and the second connection portion, and the resistor portion has a relatively higher resistance than the first connection portion and the second connection portion.

3. The display device of claim 2, wherein the resistor portion comprises a same material as the first connection portion and the second connection portion.

4. The display device of claim 3, wherein the resistor portion comprises a predetermined pattern having a curved shape.

5. The display device of claim 3, wherein the resistor portion comprises a pattern having a zigzag shape.

6. The display device of claim 2, wherein the resistor portion comprises a different material from the first connection portion and the second connection portion.

7. The display device of claim 2, wherein the connector comprises:
   a plurality of connection portions extending in the first direction and arranged in a second direction crossing the first direction to be spaced apart from each other; and
   a resistor portion disposed at at least one of the connection portions.

8. The display device of claim 1, wherein the main circuit board comprises:
   a first main line connecting the controller to the first source circuit board; and
   a second main line connecting the controller to the second source circuit board, and the first main line has a length that is different from a length of the second main line.

9. The display device of claim 1, wherein the driver further comprises:
   a first connection board connecting the main circuit board to the first source circuit board; and
   a second connection board connecting the main circuit board to the second source circuit board.

10. The display device of claim 9, wherein the first main line is connected to the first voltage line through the first connection board, and the second main line is connected to the second voltage line through the second connection board.

11. A display device comprising:
    a display panel comprising a plurality of pixels and a plurality of display pads connected to the plurality of pixels and arranged in a first direction to be spaced apart from each other; and
    a driver applying a power source voltage to the plurality of pixels, the driver comprising:
       a plurality of flexible circuit boards connected to the plurality of display pads;
       a first source circuit board comprising a plurality of voltage lines connected to a first flexible circuit boards among the plurality of flexible circuit boards;
       a second source circuit board arranged in the first direction with the first source circuit board, spaced apart from the first source circuit board in the first direction, and comprising a plurality of voltage lines connected to a second flexible circuit boards among the plurality of flexible circuit boards;
       a main circuit board comprising a controller that generates the power source voltage, a first main line connecting the controller to the first source circuit board, and a second main line connecting the controller to the second source circuit board; and
       a connector electrically connected to one voltage line among the voltage lines of the first source circuit board and one voltage line, which is the most adjacent to the one voltage line of the first source circuit board among the voltage lines of the second source circuit board, wherein the first main line has a length different from a length of the second main line.

12. The display device of claim 11, wherein the connector comprises:
    a first connection portion connected to the first voltage line disposed on the first source circuit board;
    a second connection portion connected to the second voltage line disposed on the second source circuit board; and
    a resistor portion disposed between the first connection portion and the second connection portion, and the resistor portion has a relatively higher resistance than the first connection portion and the second connection portion.

13. The display device of claim 12, wherein the resistor portion comprises a same material as the first connection portion and the second connection portion.

14. The display device of claim 13, wherein the resistor portion comprises a predetermined pattern having a curved shape.

15. The display device of claim 13, wherein the resistor portion comprises a pattern having a zigzag shape.

16. The display device of claim 12, wherein the resistor portion comprises a different material from the first connection portion and the second connection portion.

17. The display device of claim 12, wherein the connector comprises:
    a plurality of connection portions extending in the first direction and arranged in a second direction crossing the first direction to be spaced apart from each other; and
    a resistor portion disposed at at least one of the connection portions.

18. The display device of claim 11, wherein the driver further comprises:
    a first connection board connecting the main circuit board to the first source circuit board; and
    a second connection board connecting the main circuit board to the second source circuit board.

19. The display device of claim 18, wherein the first main line is connected to the first voltage line through the first connection board, and the second main line is connected to the second voltage line through the second connection board.

20. The display device of claim 11, wherein each of the first source circuit board and the second source circuit board is provided in plural, and a connector is connected between adjacent first source circuit boards and between adjacent second source circuit boards.

* * * * *